United States Patent
Huang et al.

(10) Patent No.: US 9,171,639 B2
(45) Date of Patent: Oct. 27, 2015

(54) EFUSE MACRO

(75) Inventors: Rei-Fu Huang, Hsinchu (TW); Jin-Bin Yang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 916 days.

(21) Appl. No.: 13/397,989

(22) Filed: Feb. 16, 2012

(65) Prior Publication Data

US 2012/0146664 A1 Jun. 14, 2012

Related U.S. Application Data

(62) Division of application No. 12/683,101, filed on Jan. 6, 2010, now Pat. No. 8,143,902.

(51) Int. Cl.
*G01R 31/02* (2006.01)
*G11C 17/18* (2006.01)
*H01L 23/525* (2006.01)

(52) U.S. Cl.
CPC ............. *G11C 17/18* (2013.01); *H01L 23/5256* (2013.01)

(58) Field of Classification Search
CPC ....... G11C 17/16; G11C 17/18; G11C 29/027
USPC ......................................... 324/537, 507, 550
See application file for complete search history.

(56) References Cited

U.S. PATENT DOCUMENTS

| | | | |
|---|---|---|---|
| 7,426,142 | B1 | 9/2008 | Stansell et al. |
| 7,501,879 | B1 | 3/2009 | Oh et al. |
| 2005/0280495 | A1 | 12/2005 | Douzaka et al. |
| 2006/0028894 | A1 | 2/2006 | Brennan et al. |
| 2006/0200717 | A1 | 9/2006 | Ueda |
| 2006/0268485 | A1 | 11/2006 | Yanagida |
| 2007/0133333 | A1 | 6/2007 | Hovis et al. |
| 2007/0258309 | A1 | 11/2007 | Dixon et al. |
| 2008/0025071 | A1 | 1/2008 | Anand et al. |
| 2009/0079439 | A1 | 3/2009 | Kuo |
| 2009/0175106 | A1 | 7/2009 | Aipperspach et al. |

FOREIGN PATENT DOCUMENTS

| | | |
|---|---|---|
| CN | 1818692 | 8/2006 |
| CN | 1873830 | 12/2006 |
| CN | 1993768 | 7/2007 |

*Primary Examiner* — Vincent Q Nguyen
(74) *Attorney, Agent, or Firm* — McCLure, Qualey & Rodack, LLP

(57) ABSTRACT

An eFuse with at least one fuse unit is provided. The fuse unit includes a first common node providing a first reference voltage, a second common node providing a second reference voltage, at least one fuse coupled to the first common node, and a determining unit coupled between the fuse and the second common node, generating an output signal indicating whether the fuse is blown or not according to a first condition in a normal mode and a second condition in a test mode.

11 Claims, 7 Drawing Sheets

EFUSE MACRO

This application is a Division of pending U.S. patent application Ser. No. 12/683,101, filed on Jan. 6, 2010, and entitled "Efuse Macro", the contents of which are incorporated herein by reference.

BACKGROUND OF THE INVENTION

1. Field of the Invention

The invention relates to an eFuse (electrically programmable fuse) macro, and more particularly to an eFuse macro using a serious condition for a test mode.

2. Description of the Related Art

Electrical programmable fuses (eFuses) are applied in many electronic devices. An eFuse may be programmed by blowing the eFuse after a chip is manufactured. The eFuses in VLSI silicon devices are conventionally programmed by applying a relatively large amount of power (e.g. a current with sufficient magnitude and duration) to the fuse to be programmed, so as to melt and separate the fuse body material. This changes the resistance of the eFuse from a low pre-blow resistance to a high post-blow resistance. According to the resistance of the eFuse, the state of the eFuse is sensed to determine whether the eFuse is blown or not, i.e. the eFuse is a blown fuse (programmed) or a natural fuse (un-programmed)

For a programmable device, an eFuse macro is normally configured as a chain or two-dimensional array containing at least one eFuse unit and a supporting logic circuit thereof, wherein the eFuse unit comprises one or more fuses associated with the programming and sensing circuits thereof. In general, a blown fuse may typically have a resistance greater than that of a fuse that is not blown. For example, a normal fuse that is not blown may have a resistance range from 100Ω to 1 kΩ, and a normal blown fuse may have a resistance range from 5 kΩ to 10 kΩ. However, sometimes, a blown fuse may have a resistance lower than the normal blown fuse due to process variation, programmed power or other factors, i.e. the resistance of the blown fuse is abnormal. When the blown fuse with abnormal resistance is sensed, it is very difficult to distinguish the state of the blown fuse, i.e. the blown fuse with abnormal resistance may be taken as a fuse that is not blown, thereby worsening defective parts per million (DPPM).

FIG. 1A shows a schematic of a fuse unit 100 with a reference resistor 120. The fuse unit 100 comprises a fuse 110, a reference resistor 120 and a sensing unit 130, wherein the fuse 110 is coupled between the sensing unit 130 and a ground GND and the reference resistor 120 is coupled between the sensing unit 130 and the ground GND. The sensing unit 130 senses the resistances of the fuse 110 and the reference resistor 120 to determine whether the fuse 110 is blown or not, i.e. the fuse 110 is a blown fuse or a natural fuse, wherein the resistance of the reference resistor 120 is between the resistances of the blown fuse and the natural fuse. However, the determination of the sensing unit 130 may be wrong, if the resistance of the fuse 110 is very close to the resistance of the reference resistor 120 due to process variations or other factors, i.e. the fuse 110 is a blown fuse with marginal fail resistance which is an abnormal blown fuse has a resistance similar to the reference resistor.

FIG. 1B shows a schematic of a fuse unit 200 without a reference resistor. The fuse unit 200 comprises a fuse 210, an NMOS 220, a PMOS 230 and a buffer 240. The fuse 210 is coupled between the ground GND and the NMOS 220, and the NMOS 220 is coupled between the fuse 210 and a node $N_1$. The PMOS 230 has a drain coupled to a voltage VCC and a source coupled to the node $N_1$ between the NMOS 220 and the buffer 240, wherein the PMOS 230 with a longer length may function as a resistor. The NMOS 220 may function as a switch controlled by a signal RD, wherein the signal RD is present when the state of the fuse 210 is to be read or sense. When the NMOS 220 is turned on, the buffer 240 receives a voltage from the node $N_1$ and then provides an output signal $S_{out}$ indicating whether the fuse 210 is blown or not by determining whether the voltage from the node $N_1$ exceeds a trigger point of the buffer 240. However, once the resistance of the fuse 210 being abnormal due to process variations, the voltage of the node $N_1$ may influence the determination of the buffer 240, thus a wrong output signal $S_{out}$ may be obtained.

BRIEF SUMMARY OF THE INVENTION

Efuse macros using a serious condition for a test mode are provided. An exemplary embodiment of an eFuse macro comprises at least one fuse unit. The fuse unit comprises: a common node, a sensing unit having a first input terminal and a second input terminal, at least one fuse coupled between the common node and the first input terminal of the sensing unit, having a resistance, and a switching unit coupled between the common node and the second input terminal of the sensing unit. A resistance of the switching unit is equivalent to a first resistance in a normal mode, and the resistance of the switching unit is equivalent to a second resistance in a test mode, and the second resistance is higher than the first resistance. The sensing unit generates an output signal indicating whether the fuse is blown or not according to the resistances of the fuse and the switching unit.

Moreover, an exemplary embodiment of an eFuse macro comprises at least one fuse unit. The fuse unit comprises: a first common node providing a first reference voltage; a second common node providing a second reference voltage; at least one fuse coupled to the first common node; and a determining unit coupled between the fuse and the second common node, generating an output signal indicating whether the fuse is blown or not according to a first condition in a normal mode and a second condition in a test mode.

Furthermore, another exemplary embodiment of an eFuse macro comprises at least one fuse unit. The fuse unit comprises: a common node providing a reference voltage; at least one fuse having a first terminal and a second terminal, wherein the first terminal is coupled to the common node; and a determining unit coupled between the common node and the second terminal of the fuse, generating an output signal indicating whether the fuse is blown or not according to a first condition in a normal mode and a second condition in a test mode.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. The description is made for the purpose of illustrating the general principles of the invention and should not be taken in a limiting sense. The scope of the invention is best determined by reference to the appended claims.

Figure 1A:
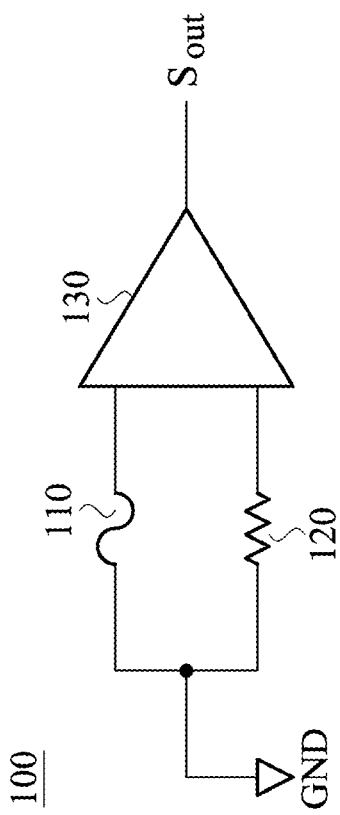
FIG. 1A shows a schematic of a fuse unit with a reference resistor according to related art.
Figure 1B:
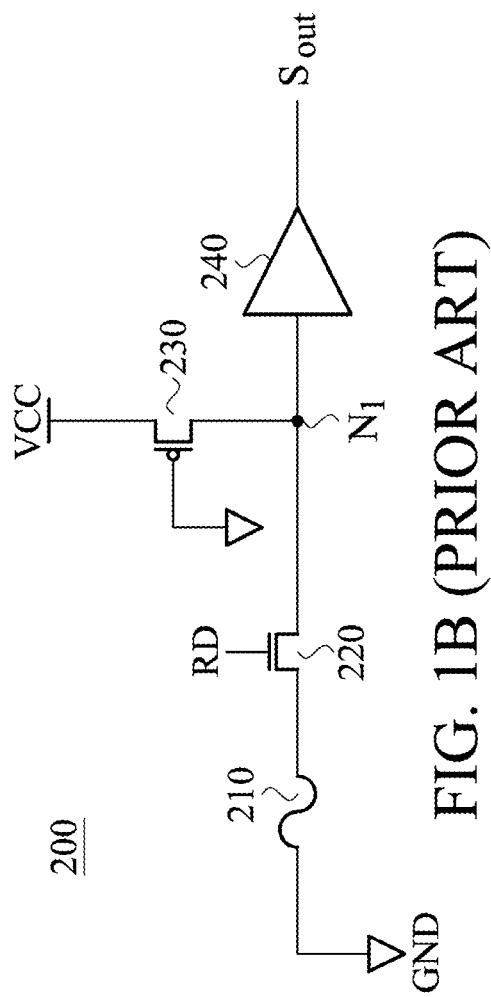
FIG. 1B shows a schematic of a fuse unit without a reference resistor according to related art.
Figure 2:
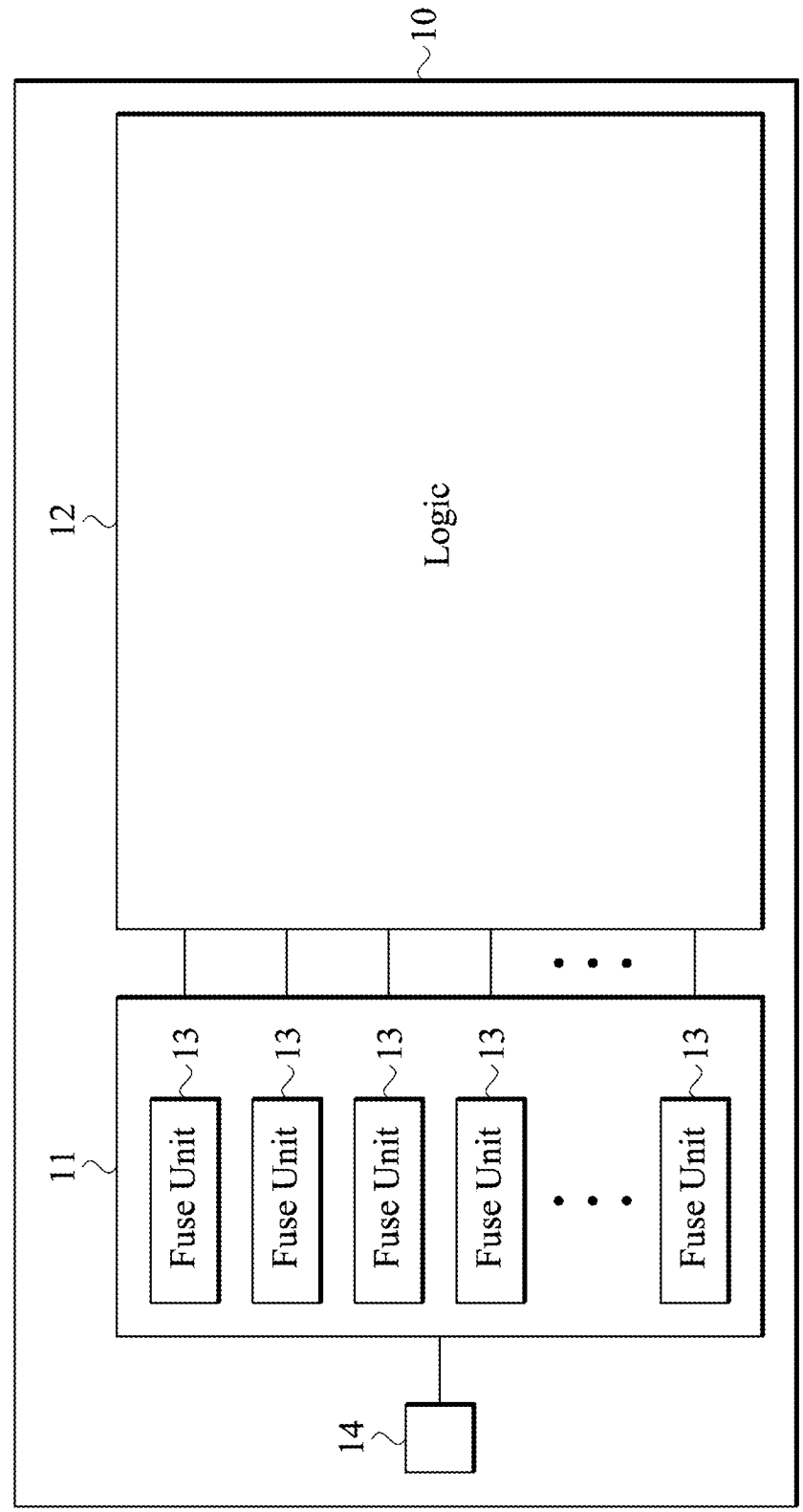
FIG. 2 shows a block diagram of an integrated circuit (IC)

FIG. 2 shows a block diagram of an integrated circuit (IC) 10. The IC 10 comprises an eFuse macro 11 and a logic circuit 12. The eFuse macro 11 comprises a plurality of fuse units 13, wherein each fuse unit 13 comprises a fuse. Each of the fuse units 13 may provide an output signal indicating whether the fuse is blown or not to the logic circuit 12 for subsequent operations. During programming the eFuse macro 11, a large current is provided to blow any designated fuse of the eFuse macro 11 via a common node 14, wherein the common node 14 may be a PAD. After programming the eFuse macro 11, a reference voltage is provided to the common node 14 for subsequent operations.

In one embodiment, the fuse unit may include: a common node providing a reference voltage; a fuse having a first terminal and a second terminal, wherein the first terminal is coupled to the common node; and a determining unit coupled between the common node and the second terminal of the fuse, generating an output signal indicating whether the fuse is blown or not according to a first condition in a normal mode and a second condition in a test mode. The fuse unit and the determining unit included therein could be implemented in different ways without departing from scope of the invention. Embodiments of the fuse unit are described below for illustrative purpose only and not meant to be limitations. In this embodiment, the fuse unit in the normal mode means the fuse unit is under normal operation related to the IC, while the fuse unit in the test mode means the fuse unit is under test.

Figure 3:
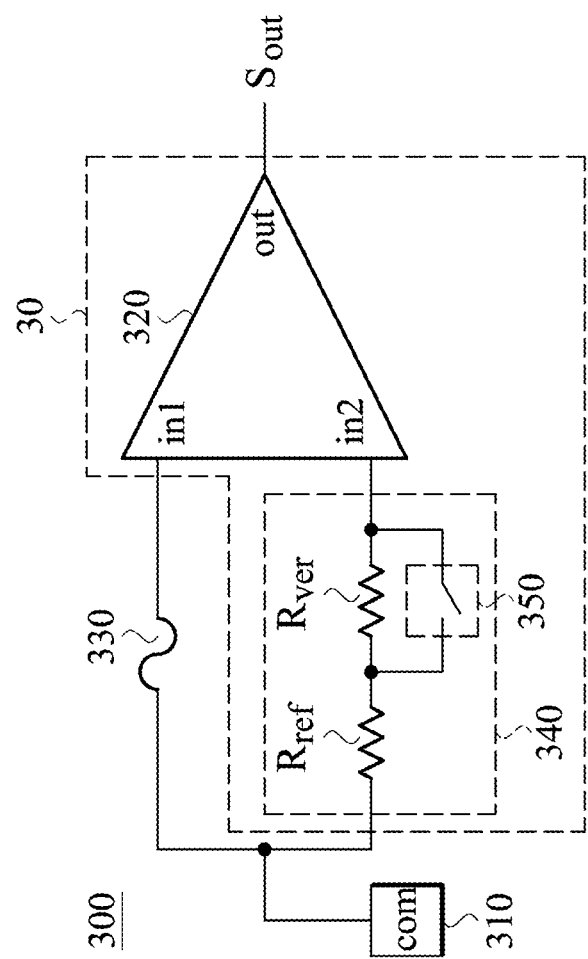
FIG. 3 shows a schematic diagram illustrating a fuse unit according to an embodiment of the invention.

FIG. 3 shows a schematic diagram illustrating a fuse unit 300 according to an embodiment of the invention. The fuse unit 300 comprises a common node 310, a fuse 330 having a first terminal and a second terminal, wherein the first terminal is coupled to the common node 310 and a determining unit 30 coupled between the common node 310 and the second terminal of the fuse 330. The determining unit 30 generates an output signal $S_{out}$ indicating whether the fuse 330 is blown or not according to a first condition in a normal mode and a second condition in a test mode. In this embodiment, the determining unit 30 includes a sensing unit 320 and a switching unit 340. The common node 310 is used to receive a reference voltage. In one embodiment, the common node 310 is a PAD of an IC. The switching unit 340 comprises a reference resistor $R_{ref}$ coupled to the common node 310, a verifying resistor $R_{ver}$ coupled between the reference resistor $R_{ref}$ and an input terminal in2 of the sensing unit 320, and a switch 350 configured in parallel with the verifying resistor $R_{ref}$, wherein the switch 350 is turned on in the normal mode and turned off in the test mode for the fuse unit 300. The fuse 330 is coupled between the common node 310 and an input terminal in1 of the sensing unit 320. When sensing that the state of the fuse 330 is in the normal mode, the switch 350 is turned on. Furthermore, in order to speed up measurement, a specific voltage may be pre-charged to the input terminals in1 and in2 of the sensing unit 320. In this embodiment, the specific voltage could be different than the reference voltage. Next, the input terminal in1 of the sensing unit 320 may obtain a voltage corresponding to a resistance of the fuse 330, and the input terminal in2 of the sensing unit 320 may obtain a voltage corresponding to a resistance of the reference resistor $R_{ref}$. According to the voltages corresponding to the resistances of the fuse 330 and the reference resistor $R_{ref}$, the sensing unit 320 generates the output signal $S_{out}$ to indicate whether the fuse 330 is blown or not in the normal mode. For example, the output signal $S_{out}$ may indicate the fuse 330 is blown when the voltage corresponding to the resistances of the fuse 330 is larger than the voltage corresponding to the resistance of the reference resistor $R_{ref}$. When sensing that the state of the fuse 330 is in the test mode, the switch 350 is turned off. Similarly, in order to speed up measurement, the specific voltage may also be pre-charged to the input terminals in1 and in2 of the sensing unit 320. Next, the input terminal in1 of the sensing unit 320 may obtain the voltage corresponding to the resistance of the fuse 330, and the input terminal in2 of the sensing unit 320 may obtain a voltage corresponding to an equivalent series resistance (ESR) of the reference resistor $R_{ref}$ and the verifying resistor $R_{ver}$. According to the voltages corresponding to the resistances of the fuse 330 and the equivalent series resistance of the reference resistor $R_{ref}$ and the verifying resistor $R_{ver}$, the sensing unit 320 generates the output signal $S_{out}$ to indicate whether the fuse 330 is blown or not in the test mode. For example, the output signal $S_{out}$ may indicate the fuse 330 is blown when the voltage corresponding to the resistances of the fuse 330 is larger than the voltage corresponding to the equivalent series resistance of the reference resistor $R_{ref}$ and the verifying resistor $R_{ver}$. Compared with the normal mode, using the verifying resistor $R_{ver}$ associated with the reference resistor $R_{ref}$ provides a serious condition to verify the fuse 330 in the test mode, so as to screen out the blown fuse with marginal fail resistance, thus improving defective parts per million (DPPM) without increasing testing time. Though resistors $R_{ref}$ and $R_{ver}$ are employed in this embodiment, any other components capable of providing appropriate resistance may apply to this invention.

Figure 4A:
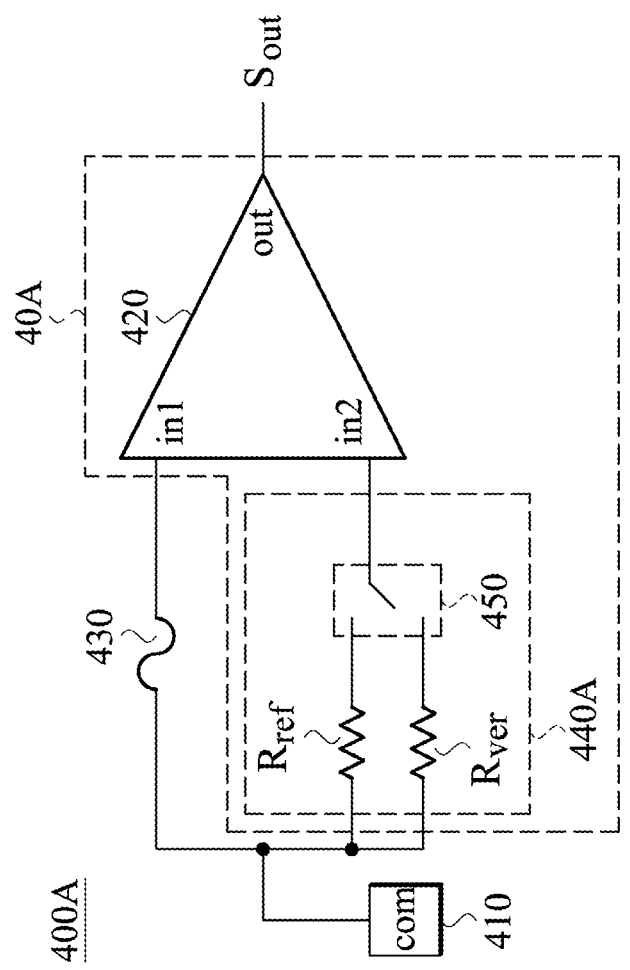
FIG. 4A shows a schematic diagram illustrating a fuse unit according to another embodiment of the invention.

FIG. 4A shows a schematic diagram illustrating a fuse unit 400A according to another embodiment of the invention. The fuse unit 400A comprises a common node 410, a fuse 430 having a first terminal coupled to the common node 410 and a second terminal, and a determining unit 40A coupled between the common node 410 and the second terminal of the fuse 430. The determining unit 40A generates an output signal $S_{out}$ indicating whether the fuse 430 is blown or not according to a first condition in a normal mode and a second condition in a test mode. In this embodiment, the determining unit 40A includes a sensing unit 420 and a switching unit 440A. Comparing the fuse unit 400A with the fuse unit 300 of FIG. 3, the switching unit 440A of FIG. 4A is different from the switching unit 340 of FIG. 3. The switching unit 440A comprises a reference resistor $R_{ref}$ coupled to the common node 410, a verifying resistor $R_{ver}$ coupled to the common node 410, and a switch 450 coupled to an input terminal in2 of the sensing unit 420. It is to be noted that, in this embodiment, the verifying resistor $R_{ver}$ is larger than the reference resistor $R_{ref}$. In addition, the switch 450 is controlled to selectively connect the reference resistor $R_{ref}$ or the verifying resistor $R_{ver}$ to the input terminal in2 of the sensing unit 420. The common node 410 is used to receive a reference voltage. The reference resistor $R_{ref}$ is coupled to the input terminal in2 of the sensing unit 420 via the switch 450 in the normal mode, and the verifying resistor $R_{ver}$ is coupled to the input terminal in2 of the sensing unit 420 via the switch 450 in the test mode. The fuse 430 is coupled between the common node 410 and an input terminal in1 of the sensing unit 420. When sensing that the state of the fuse 430 is in the normal mode, the reference resistor $R_{ref}$ is coupled to the input terminal in2 of the sensing unit 420. Furthermore, in order to speed up measurement, a specific voltage may be pre-charged to the input terminals in1 and in2 of the sensing unit 420. In this embodiment, the specific voltage could be different than the reference voltage. Next, the input terminal in1 of the sensing unit 420 may obtain a voltage corresponding to a resistance of the fuse 430, and the input terminal in2 of the sensing unit 420 may obtain a voltage corresponding to a resistance of the reference resistor $R_{ref}$. According to the voltages corresponding to the resistances of the fuse 430 and the reference resistor $R_{ref}$, the sensing unit 420 generates an output signal $S_{out}$ to indicate whether the fuse 430 is blown or not in the normal mode. For example, the output signal $S_{out}$ may indicate the fuse 430 is blown when the voltage corresponding to the resistances of the fuse 430 is larger than the voltage corresponding to the resistance of the reference resistor $R_{ref}$. When sensing that the state of the fuse 430 is in the test mode, the verifying resistor $R_{ver}$ is coupled to the input terminal in2 of the sensing unit 420. Similarly, in order to speed up measurement, the specific voltage may be also pre-charged to the input terminals in1 and in2 of the sensing unit 420. In this embodiment, the specific voltage could be different than the reference voltage. Next, the input terminal in1 of the sensing unit 420 may obtain the voltage corresponding to the resistance of the fuse 430, and the input terminal in2 of the sensing unit 420 may obtain a voltage corresponding to the verifying resistor $R_{ver}$. According to the voltages corresponding to the resistances of the fuse 430 and the verifying resistor $R_{ver}$, the sensing unit 420 generates the output signal $S_{out}$ to indicate whether the fuse 430 is blown or not in the test mode. For example, the output signal $S_{out}$ may indicate the fuse 430 is blown when the voltage corresponding to the resistances of the fuse 430 is larger than the voltage corresponding to the resistance of the verifying resistor $R_{ver}$. Compared with the normal mode, using the verifying resistor $R_{ver}$ with resistance larger than that of the reference resistor $R_{ref}$ provides a serious condition to verify the fuse 430 in the test mode, so as to screen out the blown fuse with marginal fail resistance, thus improving DPPM without increasing testing time. Though resistors $R_{ref}$ and $R_{ver}$ are employed in this embodiment, any other components capable of providing appropriate resistance may apply to this invention.

Figure 4B:
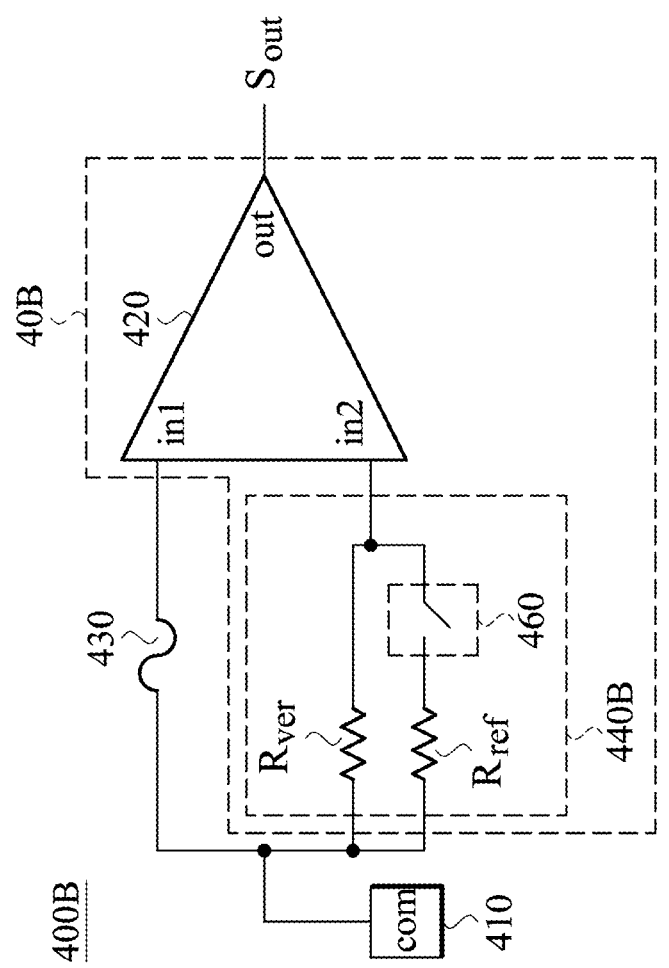
FIG. 4B shows a schematic diagram illustrating a fuse unit according to another embodiment of the invention.

FIG. 4B shows a schematic diagram illustrating a fuse unit 400B according to another embodiment of the invention. Compared to the switching unit 440A of FIG. 4A, the switching unit 440B of a determining unit 40B comprises a verifying resistor $R_{ver}$ coupled between the common node 410 and an input terminal in2 of the sensing unit 420, a reference resistor $R_{ref}$ coupled to the common node 410, and a switch 460 coupled between the input terminal in2 of the sensing unit 420 and the reference resistor $R_{ref}$. In this embodiment, the switch 460 is controlled to selectively connect the reference resistor $R_{ref}$ to the input terminal in2 of the sensing unit 420, wherein the switch 460 is turned on in the normal mode and turned off in the test mode for the fuse unit 400B. When the switch 460 is turned on, the verifying resistor $R_{ver}$ is connected with the reference resistor $R_{ref}$ in parallel. When sensing that the state of the fuse 430 is in the normal mode, the switch 460 is turned on. Furthermore, in order to speed up measurement, a specific voltage may be pre-charged to the input terminals in1 and in2 of the sensing unit 420. In this embodiment, the specific voltage could be different than the reference voltage. Next, the input terminal in1 of the sensing unit 420 may obtain a voltage corresponding to a resistance of the fuse 430, and the input terminal in2 of the sensing unit 420 may obtain a voltage corresponding to an equivalent parallel resistance of the reference resistor $R_{ref}$ and the verifying resistor $R_{ver}$. According to the voltages corresponding to the resistances of the fuse 430 and the equivalent parallel resistance of the reference resistor $R_{ref}$ and the verifying resistor $R_{ver}$, the sensing unit 420 generates the output signal $S_{out}$ to indicate whether the fuse 430 is blown or not in the normal mode. For example, the output signal $S_{out}$ may indicate the fuse 430 is blown when the voltage corresponding to the resistances of the fuse 430 is larger than the voltage corresponding to the equivalent parallel resistance of the reference resistor $R_{ref}$ and the verifying resistor $R_{ver}$. When sensing that the state of the fuse 430 is in the test mode, the switch 460 is turned off. Similarly, in order to speed up measurement, the specific voltage may also be pre-charged to the input terminals in1 and in2 of the sensing unit 420. Next, the input terminal in1 of the sensing unit 420 may obtain the voltage corresponding to the resistance of the fuse 430, and the input terminal in2 of the sensing unit 420 may obtain a voltage corresponding to the resistance of the verifying resistor $R_{ver}$. According to the voltages corresponding to the resistances of the fuse 430 and the resistance of the verifying resistor $R_{ver}$, the sensing unit 420 generates the output signal $S_{out}$ to indicate whether the fuse 430 is blown or not in the test mode. For example, the output signal $S_{out}$ may indicate the fuse 430 is blown when the voltage corresponding to the resistances of the fuse 430 is larger than the voltage corresponding to the resistance of the verifying resistor $R_{ver}$. Due to the equivalent parallel resistance of the reference resistor $R_{ref}$ and the verifying resistor $R_{ver}$ is smaller than that of the reference resistor $R_{ref}$ or the verifying resistor $R_{ver}$, only using the verifying resistor $R_{ver}$ provides a serious condition to verify the fuse 430 in the test mode, so as to screen out the blown fuse with marginal fail resistance, thus improving DPPM without increasing testing time. Though resistors $R_{ref}$ and $R_{ver}$ are employed in this embodiment, any other components capable of providing appropriate resistance may apply to this invention.

In one embodiment, the fuse unit may include: a first common node providing a first reference voltage; a second common node providing a second reference voltage; a fuse coupled to the first common node; a determining unit coupled between the fuse and the second common node, generating an output signal indicating whether the fuse is blown or not according to a first condition in a normal mode and a second condition in a test mode. The fuse unit and the determining unit included therein could be implemented in different ways without departing from scope of the invention. Embodiments of the fuse unit are described below for illustrative purpose only and not meant to be limitations. In this embodiment, the fuse unit in the normal mode means the fuse unit is under normal operation related to the IC, while the fuse unit in the test mode means the fuse unit is under test.

Figure 5:
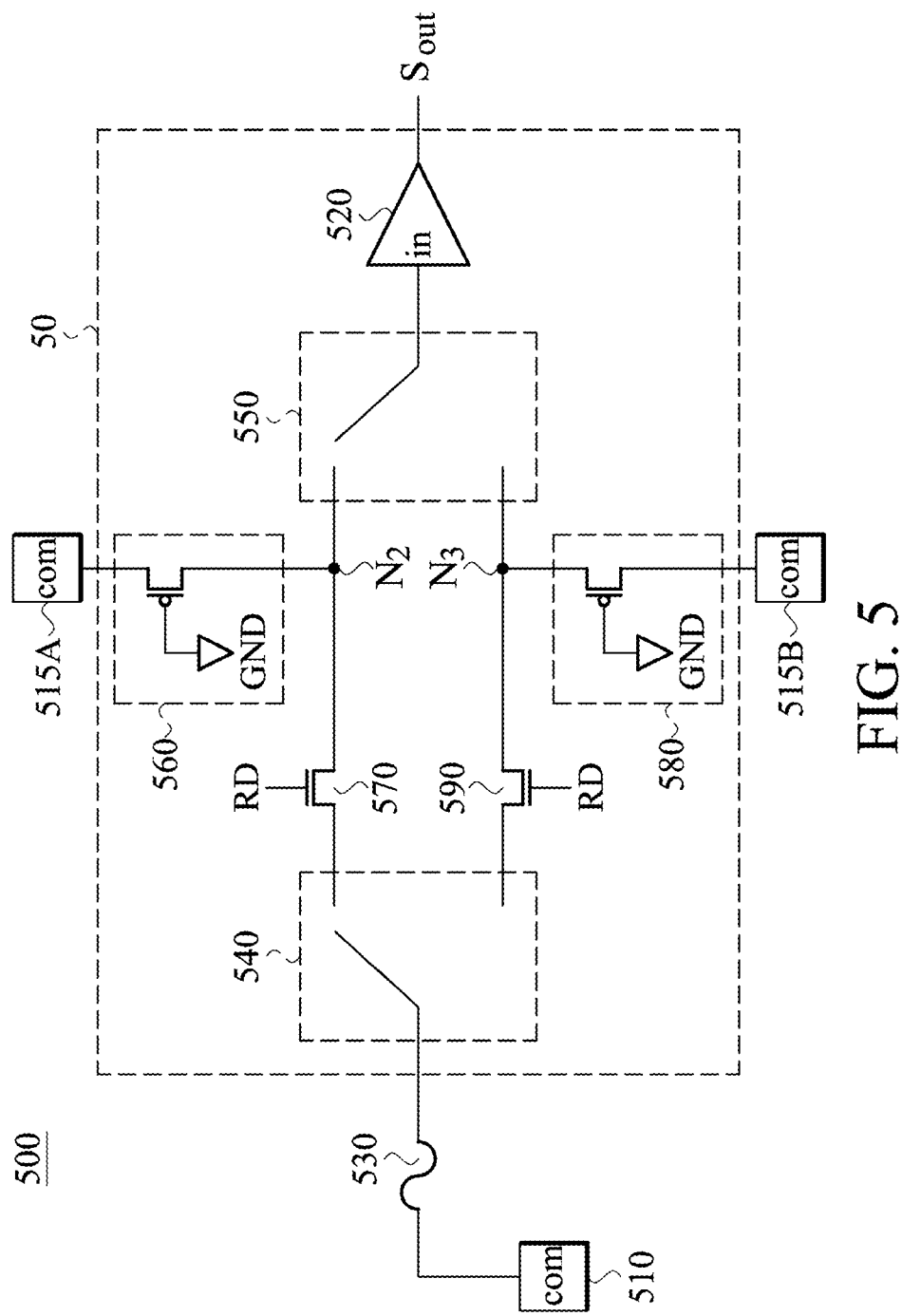
FIG. 5 shows a schematic diagram illustrating a fuse unit according to another embodiment of the invention.

FIG. 5 shows a schematic diagram illustrating a fuse unit 500 according to another embodiment of the invention. Compared with the fuse unit 300 of FIG. 3 and the fuse units 400A and 400B of FIG. 4A and FIG. 4B, the fuse unit 500 is a fuse unit without a reference resistor. In this embodiment, the fuse unit 500 comprises three common nodes 510, 515A and 515B, a fuse 530 coupled to the first common node 510, and a determining unit 50 coupled between the fuse 530 and the common nodes 515A and 515B, generating an output signal $S_{out}$ indicating whether the fuse 530 is blown or not according to a first condition in a normal mode and a second condition in a test mode. The determining unit 50 may include two switches 540 and 550, two NMOS transistors 570 and 590, two resistor units 560 and 580, and an output unit 520. In this embodiment, the common node 510 is used to receive a first reference voltage, and the common nodes 515A and 515B are used to receive a second reference voltage. However, in other embodiments, the common nodes 515A and 515B may receive different reference voltages from each other. In this embodiment, the second reference voltage is different to the first reference voltage. By switching the switches 540 and 550, the resistor unit 560 and the NMOS 570 form a first path for sensing the state of the fuse 530 (i.e. not blown or blown) in a normal mode, and the resistor unit 580 and the NMOS 590 form a second path for sensing the state of the fuse 530 in a test mode. In the embodiment, each of the resistor units 560 and 580 comprises a PMOS with a larger length that may function as a resistor, wherein the resistor unit 580 has a longer channel PMOS than that of the resistor units 560 such that a resistance of the resistor unit 580 is larger than that of the resistor unit 560. Though PMOS is employed in this embodiment, any other components capable of providing appropriate resistance may apply to this invention. In one embodiment, the resistor units 560 and 580 may comprise any device with resistance. In this embodiment, the equivalent resistance of the resistor unit 580 is larger than that of the resistor unit 560. As described, the NMOS 570 and the NMOS 590 may function as switches controlled by a signal RD, wherein the signal RD is present when the state of the fuse 530 is to be read or sense.

As shown in FIG. 5, in the normal mode, the fuse 530 and the output unit 520 are coupled to the NMOS 570 via the switch 540 and the switch 550, respectively. When the NMOS 570 is turned on, an input terminal in of the output unit 520 receives a voltage from a node $N_2$ due to fact that the first and second reference voltages are different such that the resistor unit 560, the NMOS 570 and the fuse 530 may form a voltage dividing path. Therefore, the voltage of input terminal in of the output unit 520 is generated according to a current flowing through the fuse 530. Next, the output unit 520 provides an output signal $S_{out}$ indicating whether the fuse 530 is blown or not by determining whether the voltage of input terminal in of the output unit 520 exceeds a trigger point or a specific threshold of the output unit 520. In the embodiment, the output unit 520 is a buffer. In one embodiment, the output unit 520 may be an inverter or other devices. Furthermore, in the test mode, the fuse 530 and the output unit 520 are coupled to the NMOS 590 via the switch 540 and the switch 550, respectively. Similarly, when the NMOS 590 is turned on, the input terminal in of the output unit 520 may receive a voltage from the node $N_3$ due to the resistor unit 580, the NMOS 590 and the fuse 530 forming a voltage dividing path. Next, the output unit 520 provides the output signal $S_{out}$ to indicate whether the fuse 530 is blown or not by determining whether the voltage of input terminal in of the output unit 520 exceeds the trigger point or the specific threshold of the output unit 520. Compared with the first path in the normal mode, the resistor unit 580 of the second path may provide a serious condition to verify the fuse 530 in the test mode, so as to screen out the blown fuse with marginal fail resistance, thus improving DPPM without implementing additional testing time. Though in this embodiment, when the second reference voltage is larger than the first reference voltage, the resistance of the resistor unit 580 for test mode is larger than that of the resistor unit 560 for normal mode, and the output signal $S_{out}$ indicates whether the fuse 530 is blown or not by determining whether the voltage of input terminal in of the output unit 520 exceeds the trigger point or the specific threshold of the output unit 520, other variants depending on different requirements apply to this invention as well. For example, in another embodiment, the resistance of the resistor unit 580 for test mode is smaller than that of the resistor unit 560 for normal mode, while the output signal $S_{out}$ indicates whether the fuse 530 is blown or not by determining whether the voltage of input terminal in of the output unit 520 is smaller than the trigger point or the specific threshold of the output unit 520.

Figure 6:
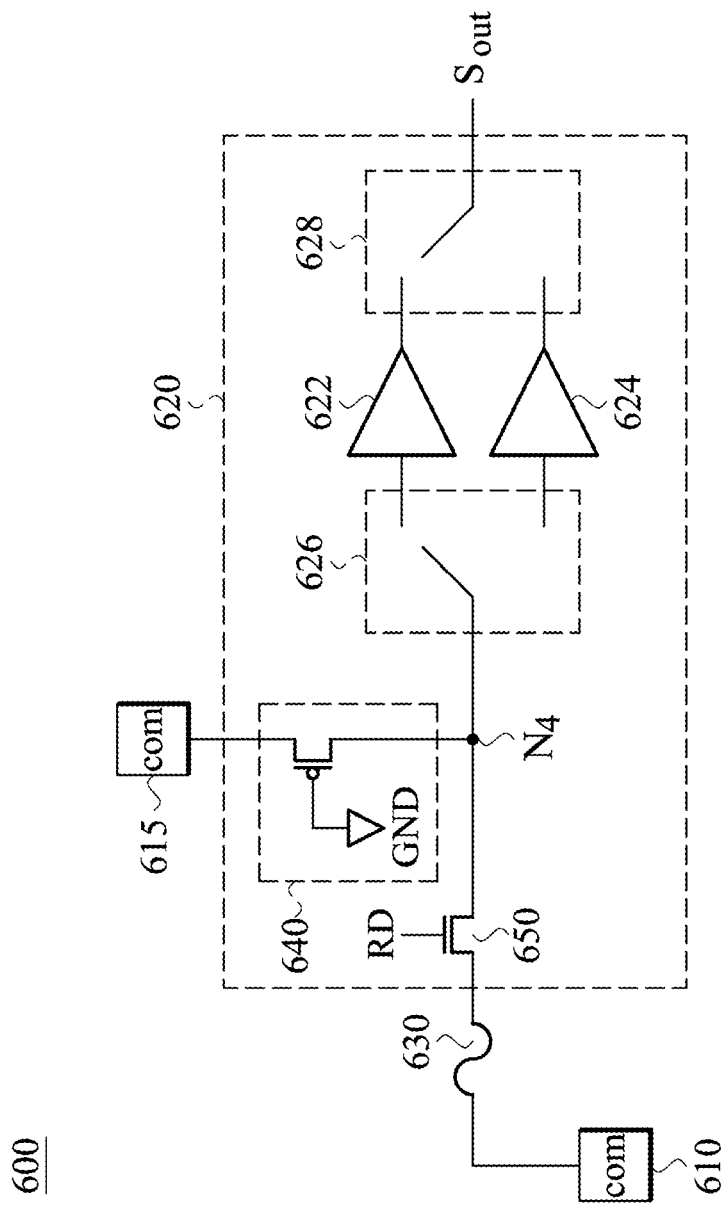
FIG. 6 shows a schematic diagram illustrating a fuse unit according to another embodiment of the invention.

FIG. 6 shows a schematic diagram illustrating a fuse unit 600 according to another embodiment of the invention, wherein the fuse unit 600 is a fuse unit without a reference resistor. In this embodiment, the fuse unit 600 comprises two common nodes 610 and 615, a fuse 630 coupled to the first common node 610, and a determining unit 620 coupled between the fuse 630 and the common node 615, generating an output signal $S_{out}$ indicating whether the fuse 630 is blown or not according to a first condition in a normal mode and a second condition in a test mode. The determining unit 620 comprises a resistor unit 640, an NMOS 650, two switches 626 and 628 and two output units 622 and 624. The common node 610 is used to receive a first reference voltage, and the common node 615 is used to receive a second reference voltage. In this embodiment, the second reference voltage is different to the first reference voltage. In the embodiment, the resistor units 640 comprise a PMOS with a larger length that may function as a resistor. Though PMOS is employed in this embodiment, any other components capable of providing appropriate resistance may apply to this invention. In one embodiment, the resistor unit 640 may comprise any device with resistance. As described above, the NMOS 650 may function as a switch controlled by a signal RD, wherein the signal RD is present when the state of the fuse 630 is to be read or sense. When the NMOS 650 is turned on, a voltage of a node $N_4$ is generated due to the fact that the first and second reference voltages are different such that the resistor unit 640, the NMOS 650 and the fuse 630 may form a voltage dividing path. Therefore, the voltage of the node $N_4$ is generated according to a current flowing through the fuse 630. By switching the switches 626 and 628, the output unit 622 is used to provide an output signal $S_{out}$ indicating the state of the fuse 630 (i.e. not blown or blown) in a normal mode, and the output unit 624 is used to provide the output signal $S_{out}$ indicating the state of the fuse 630 in a test mode. In the embodiment, the determining unit 620 is an example and does not limit the invention. In addition, in the embodiment, each of the output units 622 and 624 is a buffer. It is to be noted that, in this embodiment, the trigger points or the specific thresholds of the output units 622 and 624 are different. For example, if the first reference voltage (e.g. 0V) provided by the common node 610 is lower than the second voltage (e.g. 1V) provided by the common node 615, the trigger point of the output unit 624 is higher than that of the output unit 622, so as to screen out the blown fuse with marginal fail. Therefore, in the test mode, the abnormal blown fuses can not obtain a voltage at node $N_4$ that exceeds the trigger point of the output unit 624, thus the abnormal blown fuses are screened out, and then false actions for subsequent operations is avoided. In addition, if the first reference voltage provided by the common node 610 is higher than the second voltage provided by the common node 615, the trigger point of the output unit 624 is lower than that of the output unit 622. Thereby the determining unit 620 may provide a serious condition to verify the fuse 630 in the test mode, so as to screen out the blown fuse with marginal fail resistance, thus improving DPPM without increasing testing time.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An eFuse macro, comprising:
   at least one fuse unit, comprising:
   a first common node providing a first reference voltage;
   a second common node providing a second reference voltage;
   at least one fuse coupled to the first common node; and
   a determining unit coupled between the fuse and the second common node,
   wherein the determining unit comprises:
   a first switch and a second switch, wherein the fuse is coupled between the first common node and the first switch;
   a first resistor unit and a second resistor unit coupled to the second common node, respectively, wherein the second resistor unit has a resistance higher than that of the first resistor unit, and the fuse is selectively coupled to the first resistor unit or the second resistor unit via the first switch; and
   an output unit having an input terminal selectively coupled to the first resistor unit or the second resistor unit via the second switch, and detecting a voltage received by the input terminal to generate the output signal indicating whether the fuse is blown or not according to a first condition in the normal mode and a second condition in the test mode.

2. The eFuse macro as claimed in claim 1,
   wherein the first condition indicates that the fuse and the output unit are coupled to the first resistor unit, and the second condition indicates the fuse and the output unit are coupled to the second resistor unit.

3. The eFuse macro as claimed in claim 2, wherein the voltage received by the input terminal of the output unit is obtained according to a current flowing through the fuse.

4. The eFuse macro as claimed in claim 2, wherein the determining unit further comprises:
   a first NMOS coupled between the first switch and the first resistor unit; and
   a second NMOS coupled between the first switch and the second resistor unit,
   wherein the voltage received by the input terminal of the output unit is detected when the first NMOS and the second NMOS are turned on.

5. The eFuse macro as claimed in claim 2, wherein the output unit provides the output signal according to the voltage received by the input terminal of the output unit and a trigger point.

6. An eFuse macro, comprising:
   at least one fuse unit, comprising:
   a first common node providing a first reference voltage;
   a second common node providing a second reference voltage;
   at least one fuse coupled to the first common node; and
   a determining unit coupled between the fuse and the second common node, wherein the determining unit comprises:
   a resistor unit coupled between the second common node and a node,
   wherein the fuse is coupled between the first common node and the node and the determining unit is coupled to the fuse via the node, and the determining unit determines a voltage of the node to generate the output signal indicating whether the fuse is blown or not according to a first trigger point in a normal mode and a second trigger point in a test mode.

7. The eFuse macro as claimed in claim 6, wherein the voltage of the node is obtained according to a current flowing through the fuse.

8. The eFuse macro as claimed in claim 6, wherein a voltage of the first trigger point is lower than that of the second trigger point when the second reference voltage is higher than the first reference voltage, and the voltage of the first trigger point is higher than that of the second trigger point when the second reference voltage is lower than the first reference voltage.

9. The eFuse macro as claimed in claim 6, wherein the determining unit further comprises:
   an NMOS coupled between the node and the fuse,
   wherein the voltage of the node is detected when the NMOS is turned on.

10. The eFuse macro as claimed in claim 6, wherein the determining unit further comprises:
    a first output unit providing the output signal in the normal mode;
    a second output unit providing the output signal in the test mode; and
    a switch selectively coupling the first output unit or the second output unit to the node.

11. The eFuse macro as claimed in claim 10, wherein the first output unit receives the voltage of the node and provides the output signal according to a voltage of the first trigger point and the voltage of the node, and the second output unit receives the voltage of the node and provides the output signal according to a voltage of the second trigger point and the voltage of the node.

* * * * *